(12) United States Patent
Choo et al.

(10) Patent No.: US 8,093,172 B2
(45) Date of Patent: Jan. 10, 2012

(54) GLASS COMPOSITION, DIELECTRIC COMPOSITION AND MULTILAYER CERAMIC CAPACITOR EMBEDDED LOW TEMPERATURE CO-FIRED CERAMIC SUBSTRATE USING THE SAME

(75) Inventors: Ho Sung Choo, Gyunggi-do (KR); Jong Myeon Lee, Gyunggi-do (KR); Eun Tae Park, Gyunggi-do (KR); Myung Whun Chang, Gyunggi-do (KR); Soo Hyun Lyoo, Gyunggi-do (KR); Beom Joon Cho, Gyunggi-do (KR)

(73) Assignee: Samsung Electro-Mechanics Co. Ltd., Gyunggi-Do (KR)

( * ) Notice: Subject to any disclaimer, the term of this patent is extended or adjusted under 35 U.S.C. 154(b) by 467 days.

(21) Appl. No.: 12/271,386

(22) Filed: Nov. 14, 2008

(65) Prior Publication Data

US 2009/0135542 A1 May 28, 2009

(30) Foreign Application Priority Data

Nov. 16, 2007 (KR) ........................ 10-2007-0117233

(51) Int. Cl.
*C04B 35/468* (2006.01)
(52) U.S. Cl. ........ 501/137; 501/139; 501/32; 361/321.4
(58) Field of Classification Search ............... 501/32, 501/137, 138, 139; 361/321.4
See application file for complete search history.

(56) References Cited

U.S. PATENT DOCUMENTS

2009/0009429 A1  1/2009  Nishinaka et al.

FOREIGN PATENT DOCUMENTS

| CN | 1762899 | * | 4/2006 |
|---|---|---|---|
| DE | 2127515 | * | 12/1972 |
| FR | 2009760 | * | 9/1979 |
| JP | 2004-087420 A | | 3/2004 |
| JP | 2007-128860 A | | 5/2007 |
| JP | 2007-265749 A | | 10/2007 |
| KR | 10-2005-0091961 | | 9/2005 |

OTHER PUBLICATIONS

Hirohisa, M., et al., "Estimation of Thermal Expansion Coefficient of Silicate Glasses with Compositional Parameter", w/English language abstract thereof, 1998, pp. 444-448, vol. 62 No. 5, J-Japan Inst. Metals.

Japanese Office Action, w/ English language translation thereof, issued in Japanese Patent Application No. 2008-292668, dated Nov. 22, 2011.

* cited by examiner

*Primary Examiner* — Karl Group
(74) *Attorney, Agent, or Firm* — McDermott Will & Emery LLP

(57) ABSTRACT

Provided are a glass composition, a dielectric composition and a multi-layer ceramic capacitor embedded low temperature co-fired ceramic substrate using the same. The multi-layer ceramic capacitor embedded low temperature co-fired ceramic substrate is sinterable at a low temperature while showing a high dielectric constant. The glass composition includes a composition component expressed by a composition formula of $aBi_2O_3$-$bB_2O_3$-$cSiO_2$-$dBaO$-$eTiO_2$, where $a+b+c+d+e=100$, and a, b, c, d, and e are $40 \leq a \leq 89$, $10 \leq b \leq 50$, $1 \leq c \leq 20$, $0 \leq d \leq 10$, and $0 \leq e \leq 10$, respectively.

9 Claims, 4 Drawing Sheets

GLASS COMPOSITION, DIELECTRIC COMPOSITION AND MULTILAYER CERAMIC CAPACITOR EMBEDDED LOW TEMPERATURE CO-FIRED CERAMIC SUBSTRATE USING THE SAME

CROSS-REFERENCE TO RELATED APPLICATIONS

This application claims the priority of Korean Patent Application No. 10-2007-0117233 filed on Nov. 16, 2007 in the Korean Intellectual Property Office, the disclosure of which is incorporated herein by reference.

BACKGROUND OF THE INVENTION

1. Field of the Invention

The present invention relates to a glass composition, a dielectric composition and a multi-layer ceramic capacitor embedded low temperature co-fired ceramic substrate using the same, and more particularly, to a glass composition, a dielectric composition and a multi-layer ceramic capacitor embedded low temperature co-fired ceramic substrate using the same, which is sinterable at a low temperature while showing a high dielectric constant.

2. Description of the Related Art

Recently, a technology of reducing a total volume of a product and increasing the degree of integration of a substrate not by mounting a device such as a surface mount device on the surface of the substrate but by embedding the device into a substrate having a circuit pattern is receiving attention according to the miniaturization and high frequency tendency of various electrical products.

When a chip-typed device on the substrate is replaced with a layer-typed device (e.g., a capacitor), an increase of the volume caused by the chip may be suppressed. Also, the layer-typed capacitor has more excellent high-frequency property (smaller parasitic inductance) than the chip-typed capacitor. Accordingly, various attempts have been made to embed the chip into the substrate.

A Printed Circuit Board (PCB) is generally divided into two types according to materials forming a dielectric layer. One PCB applied with a polymeric organic material as the dielectric layer is more widely used. A plating method is used to form a circuit pattern on the PCB. On the other hand, a screen printing is mainly used to form the circuit pattern on the other PCB, the dielectric layer of which is formed of a ceramic material. In this case, the PCB is manufactured by sintering the dielectric layer and an electrode simultaneously. The sintering process is generally performed at a temperature of about 800° C. or more.

Two types of substrates have very different properties in the aspects of a material and a manufacturing process. However, their structures are very similar to each other in that the circuit pattern is formed in a laminated body of multilayer. Accordingly, their applicable ranges overlap each other in many cases. There are few technologies to which both substrates may be together applied because the material and the manufacturing process of two types of substrates are entirely different to each other as described above.

In a case where the capacitor is embedded into the ceramic substrate, a dielectric layer for a capacitor and an internal electrode are formed and simultaneously sintered between ceramic green sheets including a ceramic and a glass. In the capacitor, the dielectric constant property is important. $BaTiO_3$ may be used as a main component of composition used in the dielectric layer instead of Pb because of a high dielectric constant and environmental reason. However, $BaTiO_3$ may be sintered at a temperature of about 1400° C. or more unless a sintering additive is used. Moreover, although the sintering additive is used, $BaTiO_3$ is difficult to be sintered at a temperature of about 1000° C. or less.

In the ceramic substrate embedded with the capacitor, the dielectric constant and the sinterable temperature are important. In the ceramic substrate, an electrode is formed by printing a metal such as Ag or Cu, which is sintered to form a substrate having a circuit pattern. Accordingly, the firing temperature of the ceramic substrate must be lower than at least the melting points of Ag and Cu. However, when the capacitor is embedded, the firing temperature of the capacitor must be lower than at least the melting point of Ag and Cu because the embedded capacitor must be together sintered. In this case, as described above, the dielectric layer may not be completely sintered. Moreover, the dielectric constant may decrease.

Accordingly, the development of a technology capable of manufacturing is a low temperature co-fired ceramic substrate embedded with a multi-layer ceramic capacitor showing a high dielectric constant even after a low temperature firing is required.

SUMMARY OF THE INVENTION

An aspect of the present invention provides to a glass composition, a dielectric composition and a multi-layer ceramic capacitor embedded low temperature co-fired ceramic substrate using the same, which is sinterable at a low temperature while showing a high dielectric constant.

According to an aspect of the present invention, there is provided a glass composition, including: a composition component expressed by a composition formula of $aBi_2O_3$-$bB_2O_3$-$cSiO_2$-$dBaO$-$eTiO_2$, where a+b+c+d+e=100, and a, b, c, d, and e are $40 \leq a \leq 89$, $10 \leq b \leq 50$, $1 \leq c \leq 20$, $0 \leq d \leq 10$, and $0 \leq e \leq 10$, respectively.

Preferably, the a is $40 \leq a \leq 60$, the b is $20 \leq b \leq 30$, and the c is $5 \leq c \leq 15$.

According to another aspect of the present invention, there is provided a dielectric composition including: a main component expressed by $BaTiO_3$; and an accessory component containing a glass composition expressed by a composition formula of $aBi_2O_3$-$bB_2O_3$-$cSiO_2$-$dBaO$-$eTiO_2$, where a+b+c+d+e=100, and a, b, c, d, and e are $40 \leq a \leq 89$, $10 \leq b \leq 50$, $1 \leq c \leq 20$, $0 \leq d \leq 10$, and $0 \leq e \leq 10$, respectively.

A sintering temperature may be about 600° C. to about 900° C. The dielectric constant may be about 200 to about 300.

A volume ratio of the main component and the accessory component may be about 30 vol %/70 vol % to 50 vol %/50 vol % on the basis of a total volume.

Preferably, a mean particle diameter of the $BaTiO_3$ is about 0.1 μm to about 1 μn. A mean particle diameter of the $BaTiO_3$ is about 0.2 μm to about 0.5 μn.

According to another aspect of the present invention, there is provided a multi-layer ceramic capacitor embedded low temperature co-fired ceramic substrate, the substrate including: a ceramic laminated body laminated with a plurality of ceramic green sheets printed with a ceramic sheet internal electrode; a plurality of dielectric layers formed in the ceramic laminated body, the dielectric layers embedded with a multi-layer ceramic capacitor including a dielectric composition including $BaTiO_3$ and a glass composition expressed by a composition formula of $aBi_2O_3$-$bB_2O_3$-$cSiO_2$-$dBaO$-$eTiO_2$, where a+b+c+d+e=100, and a, b, c, d, and e are $40 \leq a \leq 89$, $10 \leq b \leq 50$, $1 \leq c \leq 20$, $0 \leq d \leq 10$, and $0 \leq e \leq 10$, respectively; and a plurality of capacitor internal electrodes formed between the dielectric layers, and electrically connected to the ceramic sheet internal electrode.

The ceramic sheet internal electrode may include one of Ag and Cu.

Preferably, a firing temperature is about 600° C. to about 900° C.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
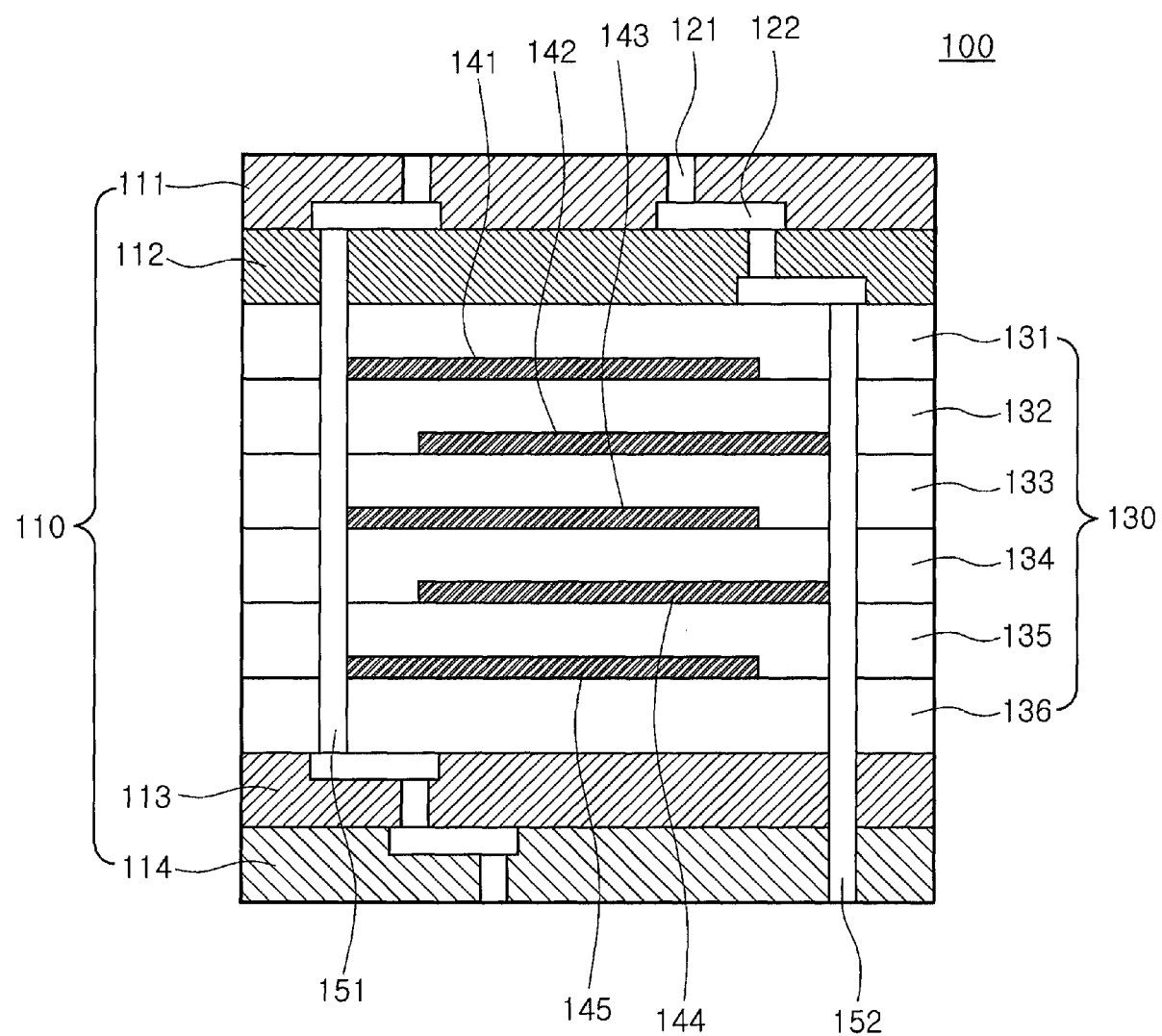
FIG. 1 is a sectional view illustrating a multi-layer ceramic capacitor (MLCC) embedded low temperature co-fired ceramic (LTCC) substrate according to an embodiment of the present invention.
Figure 2A:
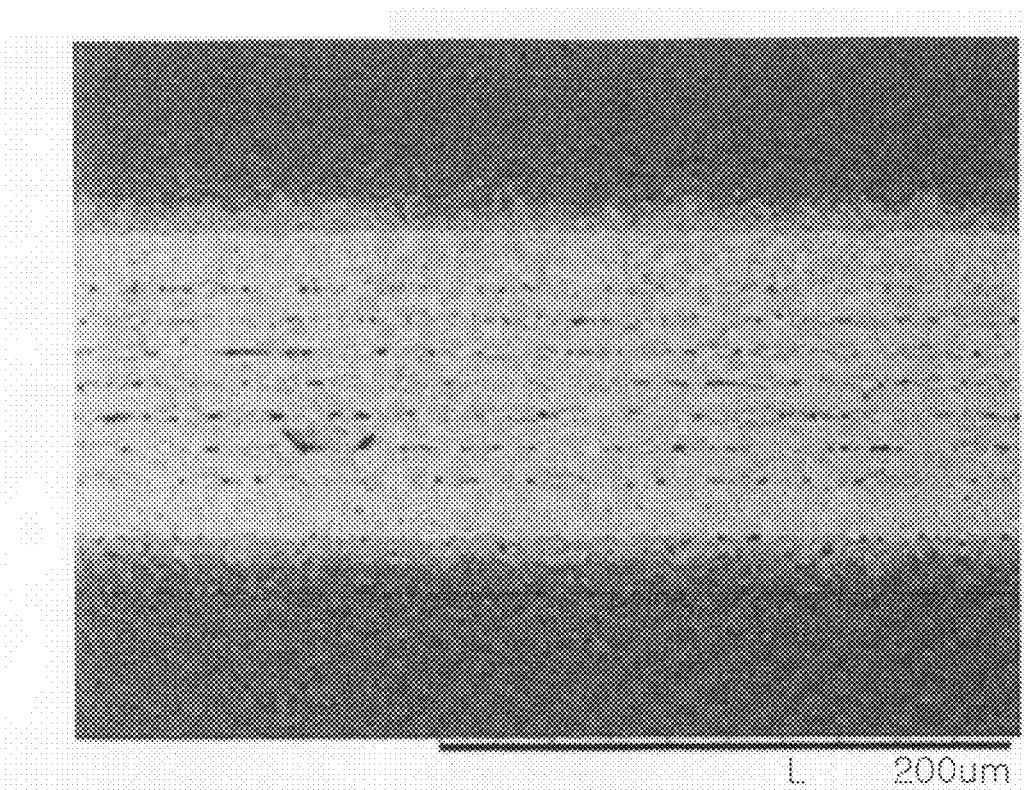
FIGS. 2a to 4b are magnified sectional views illustrating a MLCC embedded LTCC substrate manufactured according to embodiments 1 to 3.
Figure 2B:
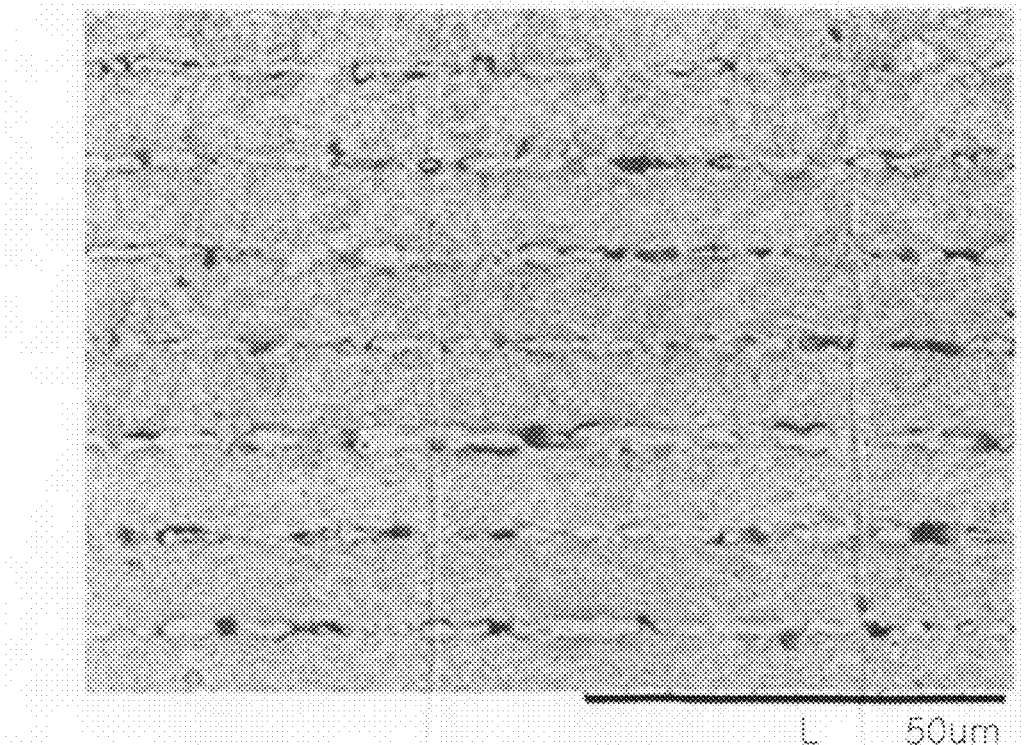
Figure 3A:
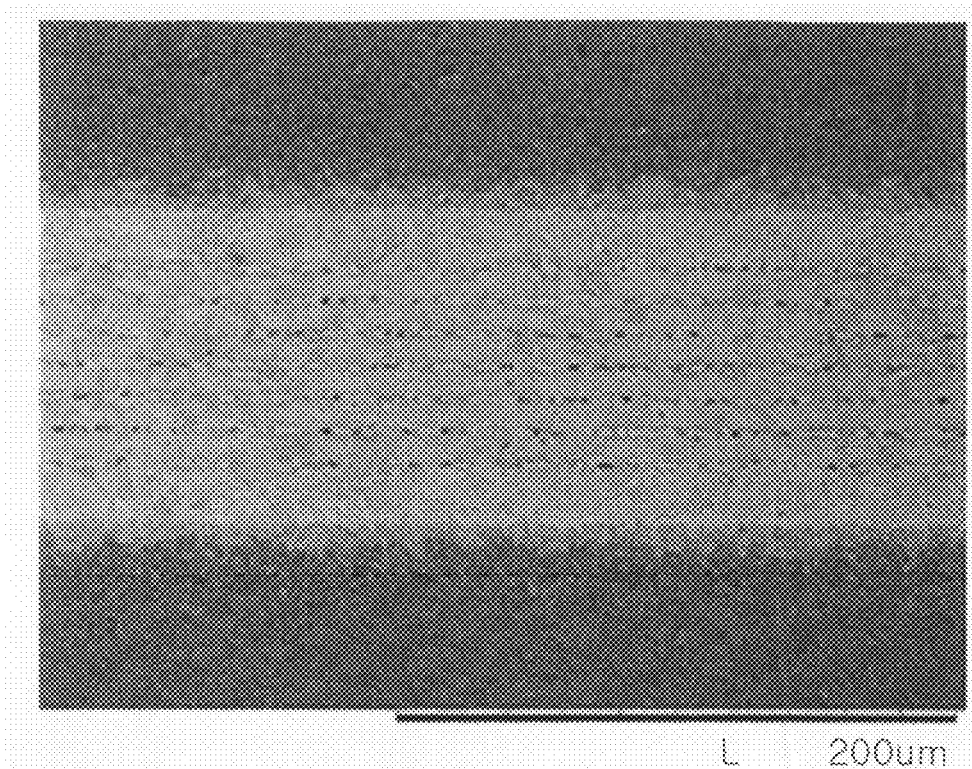
Figure 3B:
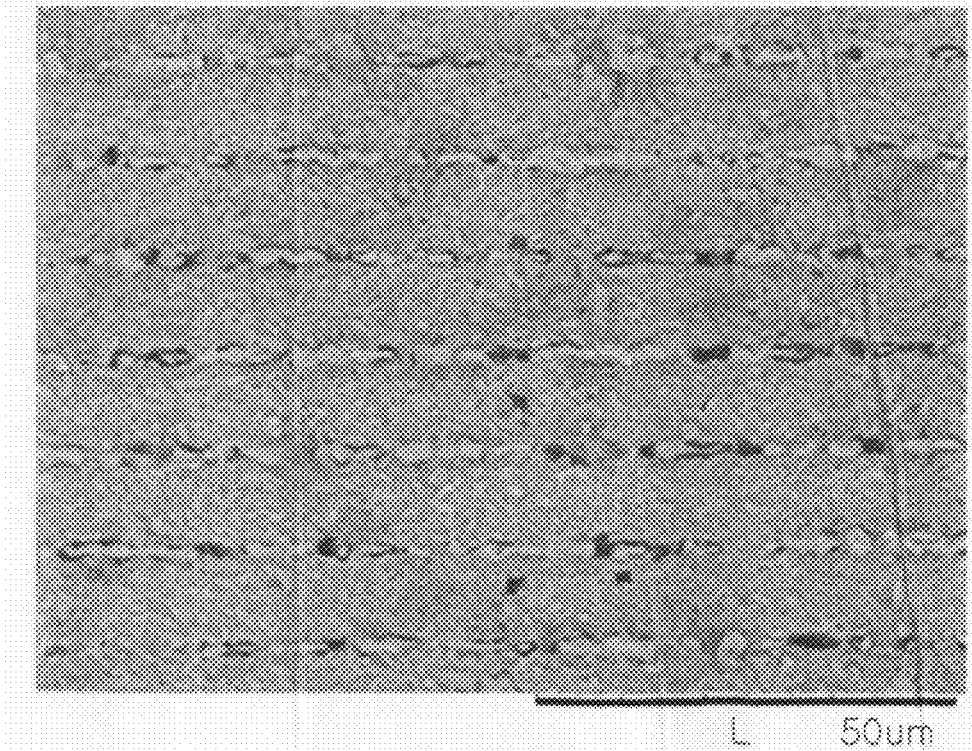
Figure 4A:
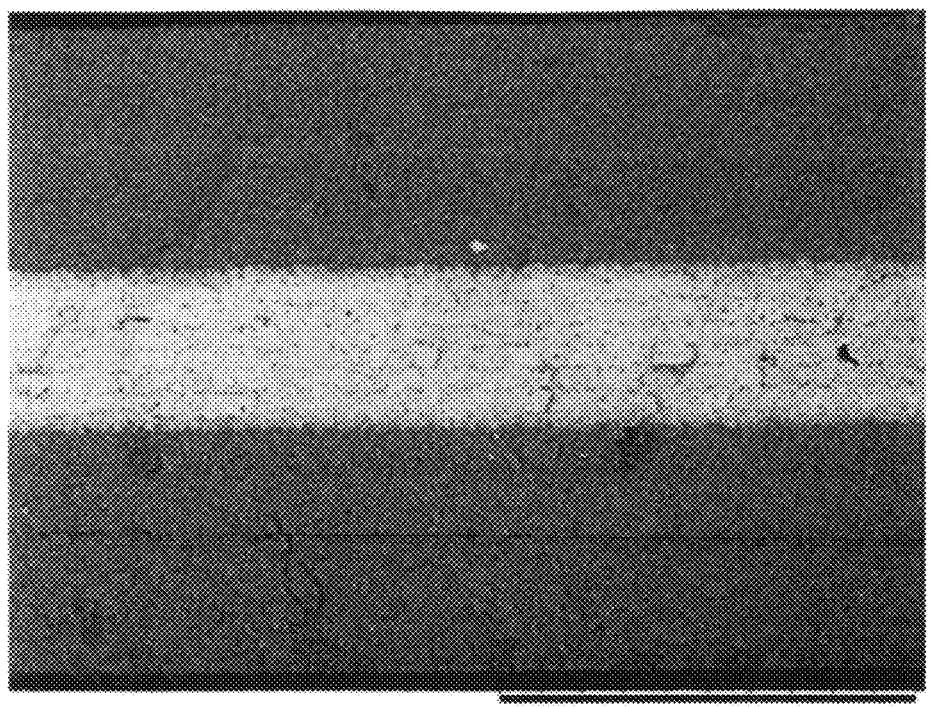
Figure 4B:
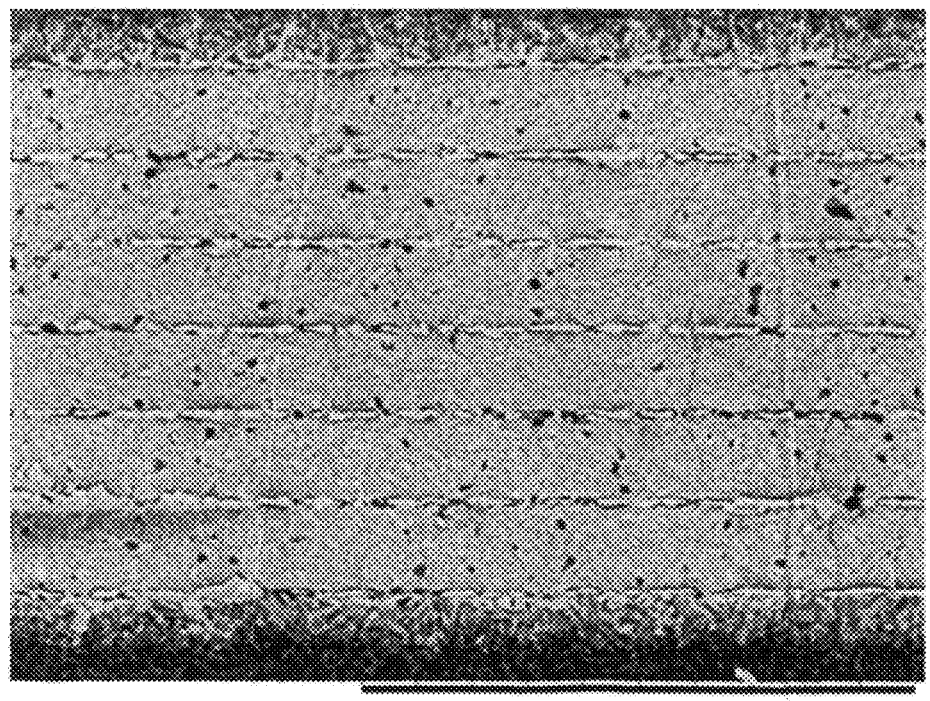

Hereinafter, exemplary embodiments of the present invention will now be described in detail with reference to the accompanying drawings. The exemplary embodiments of the present invention may be modified into various forms. Also, the scope of the present invention should not be construed as limited to the below embodiments. It will be noted that the exemplary embodiment of the present invention are provided for more complete understanding of a person skilled in the art. Therefore, the shape and size of elements shown in the drawings may be exaggerated for clarity.

A glass composition according to an embodiment of the present invention may be expressed by a composition formula $aBi_2O_3\text{-}bB_2O_3\text{-}cSiO_2\text{-}dBaO\text{-}eTiO_2$, where $a+b+c+d+e=100$, and the ranges of a, b, c, d and e are $40 \leq a \leq 89$, $10 \leq b \leq 50$, $1 \leq c \leq 20$, $0 \leq d \leq 10$ and $0 \leq e \leq 10$, respectively.

In the bismuth oxide ($Bi_2O_3$), the content of bismuth (Bi) is about 40 moles to about 99 moles when the total mole of the glass composition is 100 moles. That is, Bi affects the property of the glass composition more greatly than other components because the content of Bi is greater than other components. Bi contributes to a reduction of a glass transition temperature (Tg) of glass composition and an increase of the dielectric constant.

After densified by the sintering, Bi contributes to a crystalline structure formation of $Bi_4Ti_4O_{15}$, which is a ferroelectric material. Accordingly, Bi may be included in the glass composition at a high content as described above. However, when Bi is excessively added, there is a possibility that Bi exist in a metal form instead of an oxide form. If Bi exists in the metal form, the property of the dielectrics maybe affect. Accordingly, a more preferred Bi content is about 40 moles to about 60 moles when the total mole of glass composition is 100 moles.

The boron oxide ($B_2O_3$) is a necessary component in order to manufacture the glass composition, which is used as a network former. The boron (B) contributes to a reduction of Tg. The content of B is about 10 moles to about 50 moles, more preferably, about 20 moles to about 30 moles when the total mole of the glass composition is 100 moles.

The silica ($SiO_2$) is a necessary component like B in order to manufacture the glass composition, and used as a network former. The silicon (Si) contributes to an increase of Tg. When Si content increases, there is a tendency for the strength and temperature stability of the glass to increase. The content of Si is about 1 mole to about 20 moles, more preferably, about 5 moles to about 15 moles when the total mole of the glass composition is 100 moles.

B and Si are necessary components for the manufacture of the glass, which have different effects on Tg. B contributes the reduction of Tg, while Si contributes to the increase of Tg. It is desirable to increase the content of B instead of Si because there is a tendency for the strength and temperature stability of the glass to increase when the content of B increases.

The barium oxide (BaO) is classified into intermediate element on the manufacture of the composition. Ba regulates Tg of the glass composition, and the other properties of the glass composition. Ba is a metallic element identical to Ba contained in $BaTiO_3$, which is a principal ingredient of the dielectric composition as described below. Ba contributes to the formation of crystalline Bi4Ti4O15. The content of Ba is about 10 moles or less when the total mole of the glass composition is about 100 moles.

The Titanium oxide ($TiO_2$) is classified into intermediate element on the manufacture of the composition. Ti regulates Tg of the glass composition, and the other properties of the glass composition. Ti is a metallic element identical to Ti contained in $BaTiO_3$, which is a principal ingredient of the dielectric composition as described below. Ti contributes to the formation of crystalline $Bi_4Ti_4O_{15}$. The content of Ti is about 10 moles or less when the total mole of the glass composition is about 100 moles.

The glass composition may be manufactured according to the manufacturing process of the glass. In order to manufacture the glass composition a material powder is weighed within the content range as described above, and dry-mixed. After the material powder mixed material is melted, the melt is rapidly cooled. The rapidly-cooled material power mixed melt is firstly dry-pulverized, and secondly wet-pulverized to form the glass composition.

According to another embodiment of the present invention, a dielectric composition including a main component $BaTiO_3$ and an accessory component containing a glass composition expressed by a composition formula $aBi_2O_3\text{-}bB_2O_3\text{-}cSiO_2\text{-}dBaO\text{-}eTiO_2$ is provided, where $a+b+c+d+e=100$, and the ranges of a, b, c, d and e are $40 \leq a \leq 89$, $10 \leq b \leq 50$, $1 \leq c \leq 20$, $0 \leq d \leq 10$ and $0 \leq e \leq 10$, respectively. Description of the glass composition will be omitted because the glass composition is identical to the glass composition as described above.

For the dielectric constant of the dielectric composition according to another embodiment of the present invention, $BaTiO_3$ may be used as a ceramic filler. As described above, in order to show a desired level of the dielectric constant, Pb is used as the filler. However, due to an environmental reason of Pb, $BaTiO_3$ instead of Pb is used as the ceramic filler, which is the main component of the composition used in the dielectric layer. $BaTiO_3$ may be sintered at a temperature of about 1400° C. or more unless a sintering additive inducing a low temperature firing is used. Moreover, although the sintering additive is used, $BaTiO_3$ is difficult to be sintered at a temperature of about 1000° C. or less. Accordingly, the glass composition according to another embodiment of the present invention is together used in order to form the dielectric composition.

In the dielectric composition, the content increase of the filler is one way of increasing the dielectric constant. However, when the content of the filler is high, there is a limitation in the low temperature sintering. Accordingly, the appropriate volume ratio of glass composition and the ceramic filler is about 30/70 vol % to about 50/50 vol %.

The particle diameter of the filler affects the dielectric constant and the low temperature sintering. The mean particle diameter of the main component $BaTiO_3$ may be 0.1 μm to 1 μm, more preferably, 0.2 μm to 0.5 μm.

Although $BaTiO_3$ is used as the main component of the dielectric composition including $BaTiO_3$ as the ceramic filler and the dielectric composition according to the present invention, the sintering temperature is about 600° C. to about 900° C. In this temperature, the dielectric composition according to the present invention is sinterable, and shows a relatively high dielectric constant of about 200 to about 300.

In order to manufacture the dielectric composition according to the present invention, first, $BaTiO_3$ and a glass composition powder according to the present invention may be weighed to be a predetermined content, respectively, and manufactured into a slurry using appropriate additive and solvent. The dielectric slurry is formed into the dielectric sheet, and laminated. This dielectric composition is embedded into a low temperature co-fired ceramic substrate as the multi-layer ceramic capacitor as described below.

According to another embodiment of the present invention, a multi-layer ceramic capacitor embedded low temperature co-fired ceramic substrate is provided. The substrate includes a ceramic laminated body laminated with a plurality of ceramic green sheets printed with a ceramic sheet internal electrode, and a plurality of dielectric layers formed in the ceramic laminated body. The dielectric layers embedded with a multi-layer ceramic capacitor includes a dielectric composition having $BaTiO_3$ and a glass composition expressed by a composition formula of $aBi_2O_3$-$bB_2O_3$-$cSiO_2$-$dBaO$-$eTiO_2$, where a+b+c+d+e=100, and a, b, c, d, and e are $40 \leq a \leq 89$, $10 \leq b \leq 50$, $1 \leq c \leq 20$, $0 \leq d \leq 10$, and $0 \leq e \leq 10$, respectively.

The plurality of capacitor internal electrodes are formed between the dielectric layers, and electrically connected to the ceramic sheet internal electrode. FIG. 1 is a sectional view illustrating a multi-layer ceramic capacitor (MLCC) embedded low temperature co-fired ceramic (LTCC) substrate according to an embodiment of the present invention. Hereinafter, the MLCC embedded LTCC will be described with reference to FIG. 1. However, description of the glass composition and the dielectric composition will be omitted because the glass composition and the dielectric composition have been already described above.

A MLCC embedded LTCC substrate 100 according to the present invention includes a ceramic laminated body 110, ceramic internal electrodes 121 and 122, and a multi-layer ceramic capacitor 130. The ceramic laminated body 110 is laminated with a plurality of ceramic green sheets 111, 112, 113 and 114. The ceramic sheet internal electrodes 121 and 122 are printed in the plurality of ceramic green sheets 111, 112, 113 and 114. The multi-layer ceramic capacitor 130 is embedded into the ceramic laminated body 110.

The ceramic sheet internal electrodes 121 and 122 are electrodes for an electrical connection between the ceramic green sheets 111, 112, 113 and 114, an electrical connection between the ceramic green sheets 111, 112, 113 and 114 and the multi-layer ceramic capacitor 130, and an electrical connection between the MLCC embedded LTCC substrate 100 and an external power source. The MLCC embedded LTCC substrate 100 may be connected to the external power source by forming an external electrode at the ceramic sheet internal electrode 121 exposed to the outside.

Referring to FIG. 1, the ceramic sheet internal electrodes 121 and 122 include a via-typed electrode 121 and a pad-typed electrode 122. The MLCC embedded LTCC substrate 100 includes capacitor external connection electrodes 151 and 152 for connecting capacitor internal electrodes 141, 142, 143, 144 and 145 of the multi-layer ceramic capacitor 130 to the pad-typed ceramic sheet internal electrode 122.

The ceramic sheet internal electrodes 121 and 122, and the capacitor external connection electrodes 151 and 152 may include one of Ag and Cu. Ag or Cu is a metal representing a most excellent performance in the aspect of the electrical conductivity. Accordingly, Ag or Cu may be used as a desirable metallic electrode without any disadvantage while showing an excellent electrical conductivity at a low temperature sintering of about 600° C. to about 900° C.

The ceramic green sheets 111, 112, 113 and 114 include a ceramic filler and a glass component. The ceramic filler usable in the ceramic green sheets 111, 112, 113 and 114 may be a filler sinterable at a low temperature in consideration of the low temperature firing, even if not, may be densified due to a viscous flow caused by the sintering of the glass component. Alumina or Titania maybe used as the ceramic filler. The glass may include $B_2O_3$, $SiO_2$, $Al_2O_3$, and CaO.

The ceramic green sheets 111, 112, 113 and 114 is formed into a sheet form by mixing the filler, the glass and a bonding agent for bonding the glass and the filler in the solvent. Besides, additives such as a dispersing agent for the improvement of physical properties may be added to the ceramic green sheets 111, 112, 113 and 114.

The multi-layer ceramic capacitor 130 includes a plurality of dielectric layers 131, 132, 133, 134, 135 and 136, and a plurality of capacitor internal electrodes 141, 142, 143, 144 and 145, which are formed between a plurality of dielectric layers 131, 132, 133, 134, 135 and 136, and electrically connected to the ceramic sheet internal electrodes 121 and 122.

The dielectric layers 131, 132, 133, 134, 135 and 136 includes a main component $BaTiO_3$ and an accessory component containing a glass composition expressed by a composition formula $aBi_2O_3$-$bB_2O_3$-$cSiO_2$-$dBaO$-$eTiO_2$, where a+b+c+d+e=100, and the ranges of a, b, c, d and e are $40 \leq a \leq 89$, $10 \leq b \leq 50$, $1 \leq c \leq 20$, $0 \leq d \leq 10$ and $0 \leq e \leq 10$, respectively. The MLCC embedded LTCC substrate 100 sinterable at a low temperature as well as showing the high dielectric constant may be obtained by suppressing a high temperature sintering property of $BaTiO_3$. The firing temperature of the MLCC embedded LTCC substrates 100 according to the present invention maybe about 600° C. to about 900° C. like the general low temperature co-fired ceramic substrate.

The capacitor internal electrode 141, 142, 143, 144 and 145 may include a highly electrically conductive metal, e.g., one of Ag, Cu and Ni.

Embodiment

Hereinafter, the exemplary embodiment of the present invention will be more fully described, but not limited thereto. The dielectric constant and the dielectric loss of the MLCC embedded LTCC manufactured according to the embodiments of the present invention are measured.

First, the glass composition is formed so as to have the contents as shown in Table 1 below.

TABLE 1

|  | $Bi_2O_3$ | $B_2O_3$ | $SiO_2$ | BaO | $TiO_2$ |
|---|---|---|---|---|---|
| Embodiment 1 | 55 | 35 | 5 | 0 | 5 |
| Embodiment 2 | 55 | 35 | 5 | 5 | 0 |
| Embodiment 3 | 53 | 35 | 10 | 1 | 1 |

Material powder in Table 1 is weighed within the content range, and dry-mixed. The material powder mixed material is melted, and the melt is rapidly cooled. The rapidly cooled material powder mixed melt is firstly dry-pulverized, and secondly wet-pulverized to forma glass composition. Then, the ratio of the glass composition and the BaTiO$_3$ is weighed to be 40 vol %/60 vol %, and mixed in a solvent to be a slurry, which is molded in a sheet form.

The dielectric layer including the glass composition manufactured according to embodiments 1 to 3 is laminated together with ceramic green sheets and internal electrodes to be sintered at a temperature of about 800° C. to about 900° C. FIGS. 2a to 4b are magnified sectional views illustrating a MLCC embedded LTCC substrate manufactured according to embodiments 1 to 3. The dielectric constant and the dielectric loss of the manufactured embedding-typed capacitor are measured. The measurement result is shown in Table 2 below.

TABLE 2

|  | Dielectric constant | Dielectric loss (%) |
| --- | --- | --- |
| Embodiment 1 | 250 | 2 |
| Embodiment 2 | 280 | 2 |
| Embodiment 3 | 210 | 3 |

Referring to Table 2, the glass compositions manufactured according to embodiments 1 to 3 are used in the ceramic capacitor as a dielectric composition. Although the dielectric composition is fired at a low temperature together with BaTiO$_3$ as a main component for the dielectric constant, the electric constant is proved to be high, while the dielectric loss is proved to be low. Accordingly, the MLCC embedded LTCC substrate according to the present invention is proved to have an excellent performance of the capacitor.

The dielectric composition including the glass composition according to the embodiments of the present invention shows the high dielectric constant, while sinterable at a relatively low temperature. If the dielectric composition is used in the dielectric layer of the multi-layer ceramic capacitor, the multi-layer ceramic capacitor can be embedded into the low temperature co-fired ceramic substrate.

Also, the multi-layer ceramic capacitor having the high dielectric constant can be embedded into the low temperature co-fired ceramic substrate. Moreover, Ag or Cu electrode having a high electrical conductivity can be applied to the low temperature co-fired ceramic substrate. Accordingly, the product reliability and efficiency of the high dielectric constant MLCC embedded LTCC substrate can be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A dielectric composition comprising:
   a main component expressed by BaTiO$_3$; and
   an accessory component containing a glass composition expressed by a composition formula of aBi$_2$O$_3$-bB$_2$O$_3$-cSiO$_2$-dBaO-eTiO$_2$, where a+b+c+d+e=100, and a, b, c, d, and e are $40 \leq a \leq 89$, $10 \leq b \leq 50$, $1 \leq c \leq 20$, $0 \leq d \leq 10$, and $0 \leq e \leq 10$ in moles, respectively.

2. The dielectric composition of claim 1, wherein a sintering temperature is about 600 ° C. to about 900 ° C.

3. The dielectric composition of claim 1, wherein the dielectric constant is about 200 to 300.

4. The dielectric composition of claim 1, wherein the main component is present in an amount of 50 to 70 volume % and the accessory component is present in an amount of 30 to 50 volume %.

5. The dielectric composition of claim 1, wherein a mean particle diameter of the BaTiO$_3$ is about 0.1 μm to about 1 μm.

6. The dielectric composition of claim 1, wherein a mean particle diameter of the BaTiO$_3$ is about 0.2 μm to about 0.5 μm.

7. A multi-layer ceramic capacitor embedded low temperature co-fired ceramic substrate comprising:
   a ceramic laminated body laminated with a plurality of ceramic green sheets printed with a ceramic sheet internal electrode;
   a plurality of dielectric layers formed in the ceramic laminated body, the dielectric layers embedded with a multi-layer ceramic capacitor comprising a dielectric composition comprising BaTiO$_3$ and a glass composition expressed by a composition formula of aBi$_2$O$_3$-bB$_2$O$_3$-cSiO$_2$-dBaO-eTiO$_2$, where a+b+c+d+e=100, and a, b, c, d, and e are $40 \leq a \leq 89$, $10 \leq b \leq 50$, $1 \leq c \leq 20$, $0 \leq d \leq 10$, and $0 \leq e \leq 10$ in moles, respectively; and
   a plurality of capacitor internal electrodes formed between the dielectric layers, and electrically connected to the ceramic sheet internal electrode.

8. The multi-layer ceramic capacitor embedded low temperature co-fired ceramic substrate of claim 7, wherein the ceramic sheet internal electrode comprises one of Ag and Cu.

9. The multi-layer ceramic capacitor embedded low temperature co-fired ceramic substrate of claim 7, wherein a firing temperature is about 600° C. to 900° C.

* * * * *